(12) United States Patent
Zhang et al.

(10) Patent No.: US 8,854,141 B2
(45) Date of Patent: Oct. 7, 2014

(54) RF AMPLIFIER MODULE, INTEGRATED CIRCUIT DEVICE, WIRELESS COMMUNICATION UNIT AND METHOD THEREFOR

(75) Inventors: Hongli Zhang, Kent (GB); Bernard Mark Tenbroek, Kent (GB)

(73) Assignee: MediaTek Singapore Pte. Ltd., Singapore (SG)

( * ) Notice: Subject to any disclaimer, the term of this patent is extended or adjusted under 35 U.S.C. 154(b) by 73 days.

(21) Appl. No.: 13/540,619

(22) Filed: Jul. 3, 2012

(65) Prior Publication Data

US 2013/0009710 A1   Jan. 10, 2013

Related U.S. Application Data

(60) Provisional application No. 61/504,760, filed on Jul. 6, 2011.

(51) Int. Cl.
| | |
|---|---|
| *H03F 1/22* | (2006.01) |
| *H03F 3/72* | (2006.01) |
| *H03F 1/02* | (2006.01) |
| *H03F 3/193* | (2006.01) |

(52) U.S. Cl.
CPC ........ *H03F 1/223* (2013.01); *H03F 2203/7236* (2013.01); *H03F 3/72* (2013.01); *H03F 1/0277* (2013.01); *H03F 3/193* (2013.01); *H03F 2203/7203* (2013.01)
USPC .......................................... 330/296; 330/285

(58) Field of Classification Search
USPC .............. 330/285, 296, 310–311, 124 R, 295
See application file for complete search history.

(56) References Cited

U.S. PATENT DOCUMENTS 8,362,836 B2 * 1/2013 Gilbert et al. ................. 330/254

OTHER PUBLICATIONS

Presti, A 25 dBm Digitally Modulated CMOS Power Amplifier for WCDMA/EDGE/OFDM With Adaptive Digital Predistortion and Efficient Power Control, IEEE Journal of Solid-State Circuits, pp. 1883-1896, vol. 44, No. 7, Jul. 2009.

* cited by examiner

*Primary Examiner* — Hieu Nguyen
(74) *Attorney, Agent, or Firm* — Winston Hsu; Scott Margo

(57) ABSTRACT

A radio frequency (RF) amplifier module has a digitally controllable amplifier to receive a first biased signal, a further biased signal, and a digital control signal including a less significant bit (LSB) component and a more significant bit (MSB) component. The digitally controllable amplifier has an LSB module operating according to the first biased signal and the LSB component, and an MSB module operating according to the further biased signal and the MSB component. The RF amplifier module further has a biasing component to apply a first, operating DC bias voltage to the further biased signal when the digitally controllable amplifier operates in a higher gain mode and the MSB module outputs a load current component, and apply a second, higher DC bias voltage to the further biasing signal when the digitally controllable amplifier operates in a lower gain mode and the MSB module outputs the load current component.

20 Claims, 12 Drawing Sheets

RF AMPLIFIER MODULE, INTEGRATED CIRCUIT DEVICE, WIRELESS COMMUNICATION UNIT AND METHOD THEREFOR

CROSS REFERENCE TO RELATED APPLICATIONS

This application claims the benefit of U.S. provisional application No. 61/504,760, filed on Jul. 6, 2011, and incorporated herein by reference.

BACKGROUND

The field of this invention relates to a radio frequency amplifier module, an integrated circuit device, a wireless communication unit and a method therefor. The invention is applicable to, but not limited to, a method and apparatus for digitally controllable amplification of an RF signal.

The near-far effect is a situation that is common in wireless communication systems. The near-far effect is a condition in which a strong (e.g. near) signal captures a receiver making it difficult for the receiver to detect a weaker (e.g. far off) signal. The near-far effect is particularly problematic in code division multiple access (CDMA) systems where transmitters share transmission frequencies and transmission time.

To overcome the near-far effect, wireless communications systems such as the $3^{rd}$ Generation (3G) of mobile telephone standards and technology (WCDMA, TDSCDMA, etc) developed by the $3^{rd}$ Generation Partnership Project (3GPP™) (www.3gpp.org), require a wide range (e.g. around 74 dB) of accurate power control within the transmitters. Radio frequency amplifier gain control range is the range, usually given in dB, between the smallest and largest gain levels. To cover process and temperature variations, a gain control range of at least, say, 85 dB is desirable. Digitally programmable driver amplifiers are most widely used in deep-submicron CMOS 3G transmitter architectures.

The lowest gain settings are often limited by signal leakage. As such, in conventional transmitters, most of the gain control range is typically implemented at the radio frequency for better carrier leakage performance at low power levels. Additionally, finite isolation of the off-state gain cells can limit the gain control range that can be practically implemented in a single stage. Accordingly, in conventional transmitter implementations, more than one gain control stage is typically adopted to achieve enough isolation at low power levels to achieve a wide gain control range. However, additional stages increase both current and area. Also more stages make it more difficulties to meet the stringent noise and linearity requirements for a 3G SAW-less transmitter design.

FIG. 1 illustrates a simplified circuit diagram of an example of a digitally programmable amplifier 100. The paper "Direct-Conversion WCDMA Transmitter with −163 dBc/Hz Noise at 190 MHz Offset"; Analog Devices, West Mailing, United Kingdom, which is published in Solid-State Circuits Conference, 2007, ISSCC 2007, Digest of Technical Papers, IEEE International, describes an example of such a digital programmable amplifier, and is incorporated in its entirety herein by reference.

The amplifier 100 comprises a first, less significant bits (LSB) component 110 comprising a resistor attenuator ladder 115, which in the illustrated example comprises an R-2R resistor attenuator ladder, and a plurality of gain cells 120 coupled to respective 'tap' points within the R-2R resistor attenuator ladder 115. Each gain cell 120 within the LSB component 110 is arranged to receive, and be controllable via, a respective less significant control bit (b0, b1, b2, b3) 125. In some examples, the gain cells 120 within the LSB component 110 comprise equal gain cells. The R-2R resistor attenuator ladder 115 is operably coupled to a load impedance (Zload) 105 of the amplifier 100. In this manner, the LSB component 110 of the amplifier 100 is arranged to drive an LSB output current component of the amplifier 100 in accordance with the less significant control bits 125. In some examples, only one gain cell 120 within the LSB component 110 is switched on (via the respective control bit 125) at a time.

The amplifier 100 further comprises a further, more significant bit(s) (MSB) component 130 coupled to the load impedance 105 of the amplifier, either directly or via a balun or the like (not shown), bypassing the R-2R resistor attenuator ladder 115 of the LSB component 110. The MSB component 130 comprises one or more gain cells 140 operably coupled in parallel and each arranged to receive, and be controllable via, respective more significant control bits (b4, b5, b6, b7) 145. In some examples, the gain cells 140 of the MSB component 130 may comprise unary weighted cells, binary weighted cells, or a combination of unary and binary weighted cells. In some examples, each gain cell 140 within the MSB component 130 may be switched 'on' and 'off' (via the respective control bit 145) substantially independently of the other gain cells 140 within the MSB component 130.

In some examples, the LSB component 110 and the MSB component 130 are arranged to operate exclusively of each other such that when a gain cell 120 of the LSB component 110 is switched on, all gain cells 140 of the MSB component 130 are switched off. Conversely, when at least one gain cell 140 of the MSB component 130 is switched on, all gain cells 120 of the LSB component 110 are switched off.

The number of R-2R stages within the R-2R resistor attenuator ladder 115 typically depends on the gain control requirement. In the illustrated example, a four-stage R-2R resistor attenuator ladder 115 is illustrated, for example enabling a 24 dB gain control range.

Referring now to FIG. 2, there is illustrated a simplified circuit diagram of an example of an implementation of a unit gain cell, such as one of the unit gain cells 120, 140 within the LSB component 110 and/or the MSB component 130 of the amplifier 100. In the example illustrated in FIG. 2, one of the unit gain cells 140 of the MSB component 130 is illustrated and comprises a cascode common source amplifier 200. An RF input voltage (Vin) 245 to be amplified is provided to a gate 212 of a first transistor (M1) 210 within the cascode common source amplifier 200. The RF input voltage 245 comprises an alternating current (AC) signal and a direct current (DC) bias voltage. The control bit signal (Vb) 145 is provided to a gate 222 of a second transistor (M2) 220 within the cascode common source amplifier 200. In this manner, the control bit signal 145 provides a static enable control voltage to bias the gate 222 of the second transistor (M2) 220 to 'turn on' or 'turn off' the cascode common source amplifier 200. Notably, such a cascode common source amplifier 200 may also be used to implement the gain cells 120 of the LSB component 110 of the amplifier 100.

Referring now to FIG. 3, there is illustrated a simplified circuit diagram of the digitally programmable amplifier 100 of FIG. 1 in which the gain cells 120, 140 of the LSB and MSB components 110, 130 are implemented by way of cascode common source amplifiers, such as the cascode common source amplifier 200 illustrated in FIG. 2. For simplicity, only a single gain cell 120, 140 within each of the LSB and MSB components 110, 130 is illustrated in FIG. 3. The RF input voltage (Vin) 245 to be amplified, comprising an AC RF signal (V1) 310 and a DC bias voltage (Vin_bias) 315, is provided to the gate of a first transistor (M1) 320, (M5) 340 within the cascode common source amplifier of each of the gain cells 120, 140 of the LSB and MSB components 110, 130. The control bit signals 125, 145 (FIG. 1) are provided to the gate of a second transistor (M1c) 325, (M5c) 345 within the cascode common source amplifier of each of the gain cells 120, 140 of the LSB and MSB components 110, 130.

In the scenario illustrated in FIG. 3, the digitally programmable amplifier 100 is programmed to operate in a minimum power level mode, whereby a least significant control bit signal 125 (Vb) is 'set' in order to turn on the least significant gain cell 120 within the LSB component 130 (i.e. the leftmost gain cell in the illustrated example). All other control bit signals 125, 145 are 'unset' in order to turn off all other gain cells 120, 140 within the digitally programmable amplifier 100. Accordingly, a gate of the second transistor (M5c) 345 within the cascode common source amplifier of the gain cell 140 of the MSB component 130 is illustrated as being tied to ground. As such, in this minimum power level mode, the digitally programmable amplifier 100 is operating at a lowest end of its gain control range.

A 'wanted' signal 350 is output to the load impedance 105 by the R-2R resistor attenuator ladder 115 as a result of the least significant gain cell 120 within the LSB component 110 being turned on. An unwanted leaked signal 355 is also illustrated in FIG. 3. This unwanted leaked signal 355 is a result of a signal leakage path 360 through the gain cells 140 within the MSB component 130.

FIG. 4 illustrates a simplified circuit diagram of a small signal equivalent network for the gain cells 140 of the MSB component 130 when in an off-state, such as illustrated in FIG. 3. Even when in such an off-state, the RF input voltage 245 to be amplified is received at the gate 410 of the first transistor (M5) 340 within the cascode common source amplifier of each gain cell 140 within the MSB component 130. The small signal equivalent network illustrated in FIG. 4 is representative of all of the gain cells 140 within the MSB component 130. Accordingly, the combined gate-to-drain capacitance (Cgd_M5) 415 of the first transistors (M5) 340 within the gain cells 140 within the MSB component 130 is sufficient to couple the RF input voltage 245 to the drain node 420 thereof, which also comprises the respective source node of the second transistor (M5c) 345 within the gain cell 140. Thus, the source node 420 of the second transistor (M5c) 345 will see a voltage swing resulting from the RF input voltage 245, which will leak through the second transistor (M5c) 345 network, which comprises parasitic capacitances 430 from gate to drain/source overlap, body to drain/source junctions and metal routing etc, to the load impedance 105 in the form of the unwanted leak signal 355.

When the digitally programmable amplifier 100 is programmed to operate in a minimum power level mode, as illustrated in FIG. 3, this unwanted leak signal 355 is particular significant compared to the low level wanted output signal 350, and thus has a significant impact on the achievable gain control range.

FIG. 5 illustrates a simplified circuit diagram of the digitally programmable amplifier 100 of FIG. 3 comprising a known solution to improving the isolation of the gain cells 140 within the MSB component 130 when in an off state. A shunt switch (M5_s) 510 is coupled between the mutual node 420 (of FIG. 4) of the cascode common source amplifier of the gain cell 140 and ground. In this manner, the shunt switch M5_s 510 may be closed (e.g. by setting EN to high in the illustrated example) in order to tie the mutual node 420 of the cascode common source amplifier of the gain cell 140 to ground. In this manner, the voltage across drain output resistance (Rout_M5) 440 (FIG. 4) of the cascode common source amplifier is reduced, thereby reducing the swing seen by the source node 420 (of FIG. 4) of the second transistor (M5c) 345 of the cascode common source amplifier, and thus the leakage signal there through. Thus, improved isolation of the gain cells 140 is achieved without the need for additional gain control stages. However, such a solution results in additional parasitic capacitance on the drain of the first transistor (M5) 340 of the cascode common source amplifier, which is not desirable during high gain operation; i.e. when the gain cell 140 is in an on state. In addition, the inclusion of such a shunt switch (M5_s) 510 to all gain cells 140 within the MSB component 130 increases layout complexity and die area.

Thus, a need exists for an improved RF amplifier module, and method of operation thereof.

SUMMARY

Accordingly, the invention seeks to mitigate, alleviate or eliminate one or more of the above mentioned disadvantages singly or in any combination. Aspects of the invention provide a method for digitally controllable amplification of an RF signal.

According to a first aspect of the invention, there is provided a radio frequency (RF) amplifier module comprising at least one digitally controllable amplifier arranged to receive a first biased signal comprising an alternating current (AC) signal to be amplified and a first direct current (DC) bias component, at least one further biased signal comprising the AC signal to be amplified and an at least one further DC bias component, and at least one digital control signal comprising at least one less significant bit (LSB) component and at least one more significant bit (MSB) component. The at least one digitally controllable amplifier comprising at least one LSB module comprising at least one gain cell arranged to selectively output a load current component corresponding to the first biased signal in accordance with at least one respective bit within the LSB component of the at least one digital control signal, and at least one MSB module comprising at least one gain cell arranged to selectively output a load current component corresponding to the at least one further biased signal in accordance with at least one respective bit within the MSB component of the at least one digital control signal. The at least one RF amplifier module further comprising at least one biasing component arranged to receive the AC signal to be amplified and to output the first and at least one further biased signals to the at least one digitally controllable amplifier. The at least one biasing component is further arranged to apply a first operating DC bias voltage to the at least one further biased signal when the at least one digitally controllable amplifier is configured to operate in a higher gain mode wherein the at least one MSB module is configured to output a load current component, and to apply a second, higher DC bias voltage to the at least one further biasing signal when the at least one digitally controllable amplifier is configured to operate in a lower gain mode, wherein the at least one MSB module is not configured to output a load current component.

Thus, in this manner, the LSB and MSB components of the digitally controllable amplifier may be provided with substantially independent DC bias voltages. As such, and as described in greater detail below, improved isolation of gain cells may be achieved within, for example, the MSB component when only gain cells within the LSB component are active (e.g. when the digitally controllable amplifier is operating at low power levels), for example by increasing the DC bias voltage of the biased signal provided to the gain cells of the MSB component. Thus, by improving the isolation of the gain cells within the MSB component when the digitally controllable amplifier is operating at low power levels in this manner, unwanted leakage signals may also be reduced at low power levels, thereby enabling an improved gain control range to be achieved.

According to an optional feature of the invention, the MSB module may comprise a plurality of independently controllable gain cells arranged to selectively output load current components corresponding to the at least one further biased signal in accordance with respective bits within the MSB component of the at least one digital control signal.

According to an optional feature of the invention, the LSB module may comprise a plurality of controllable gain cells arranged to be individually selectable to output a load current component corresponding to the first biased signal in accordance with respective bits within the LSB component of the at least one digital control signal.

According to an optional feature of the invention, the digitally controllable amplifier may further comprise a resistor attenuator ladder structure, and the plurality of gain cells within the LSB module are coupled to respective tap points within the resistor attenuator ladder.

According to an optional feature of the invention, the at least one gain cell of the MSB module may be arranged to be coupled directly to a load impedance of the digitally controllable amplifier.

According to an optional feature of the invention, the at least one gain cell of the MSB module may comprise a cascode common source amplifier; the cascode common source amplifier comprising a first transistor arranged to receive at a gate thereof the at least one further biased signal and a second transistor arranged to receive at a gate thereof the respective bit within the MSB component.

According to an optional feature of the invention, the at least one gain cell of the MSB module may comprise a decoupling capacitance operably coupled to the gate of the second transistor of the cascode common source amplifier.

According to an optional feature of the invention, the first transistor of the cascode common source amplifier may comprise a multiple gated transistor arranged to receive at multiple gates thereof, the at least one further biased signal.

According to a second aspect of the invention, there is provided an integrated circuit device comprising a radio frequency (RF) amplifier module according to the first aspect of the invention.

According to a third aspect of the invention, there is provided a wireless communication unit comprising a radio frequency (RF) amplifier module according to the first aspect of the invention.

According to a fourth aspect of the invention, there is provided a method of digitally controllable amplification of an RF signal. The method comprises generating a first biased signal comprising an alternating current (AC) signal to be amplified and a first direct current (DC) bias component, generating at least one further biased signal comprising the AC signal to be amplified and an at least one further DC bias component, and selectively outputting at least one load current component corresponding to at least one from a group comprising the first biased signal in accordance with at least one respective bit within at least one less significant bit (LSB) component of at least one digital control signal, and the at least one further biased signal in accordance with at least one respective bit within at least one more significant bit (MSB) component of the at least one digital control signal. The method further comprises applying the first DC bias to the at least one further biased signal when a load current corresponding to the at least one further biased signal is to be output, and to apply a higher DC bias to the at least one further biasing signal when a load current corresponding to the at least one further biased signal is not to be output.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

The present invention will now be described with reference to an example of a radio frequency (RF) transmitter architecture for use within, say, a wireless telecommunication handset and adapted in accordance with some embodiments of the present invention. However, it will be appreciated that the inventive concept described herein is not limited to specific features of the illustrated example, and may equally be implemented within alternative applications. In particular, it is contemplated that the inventive concept described herein may be implemented within substantially any RF transmitter device requiring a large gain control range.

Figure 6:
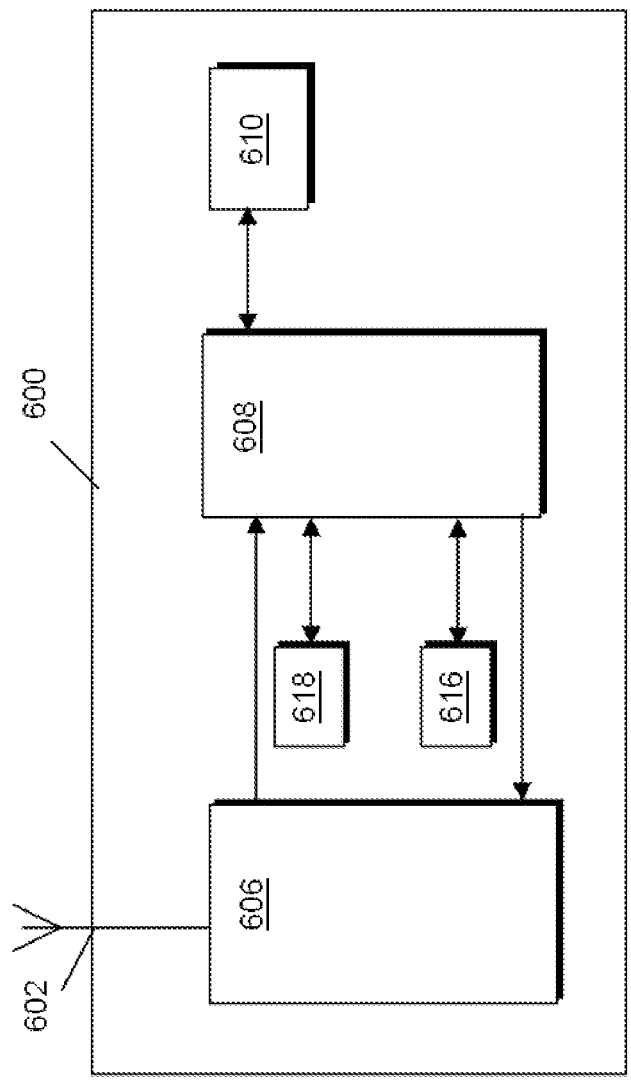
FIG. 6 illustrates a simplified block diagram of an example of a part of a communication unit.

Referring first to FIG. 6, there is illustrated an example of a simplified block diagram of part of a communication unit 600 adapted to support the inventive concepts of an example of the present invention. The communication unit 600, in the context of the illustrated embodiment of the invention, is a wireless telecommunication handset comprising an antenna 602. As such, the communication unit 600 contains a variety of well known radio frequency components or circuits 606, operably coupled to the antenna 602. Within modern communications devices, such as those adapted to support wireless communications systems such as the 3$^{rd}$ Generation (3G) of mobile telephone standards and technology (WCDMA, TDSCDMA, etc) developed by the 3$^{rd}$ Generation Partnership Project (3GPP™) (www.3gpp.org), such radio frequency components or circuits 606 typically comprise one or more digitally programmable driver amplifiers, in addition to other common and well known transceiver components and/or circuits that will not be described further herein. The communication unit 600 further comprises signal processing logic 608. An output from the signal processing logic 608 is provided to a suitable user interface (UI) 610 comprising, for example, a display, keypad, microphone, speaker, etc.

For completeness, the signal processing logic 608 is coupled to a memory element 616 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 618 is typically coupled to the signal processing logic 608 to control the timing of operations within the communication unit 600.

Figure 7:
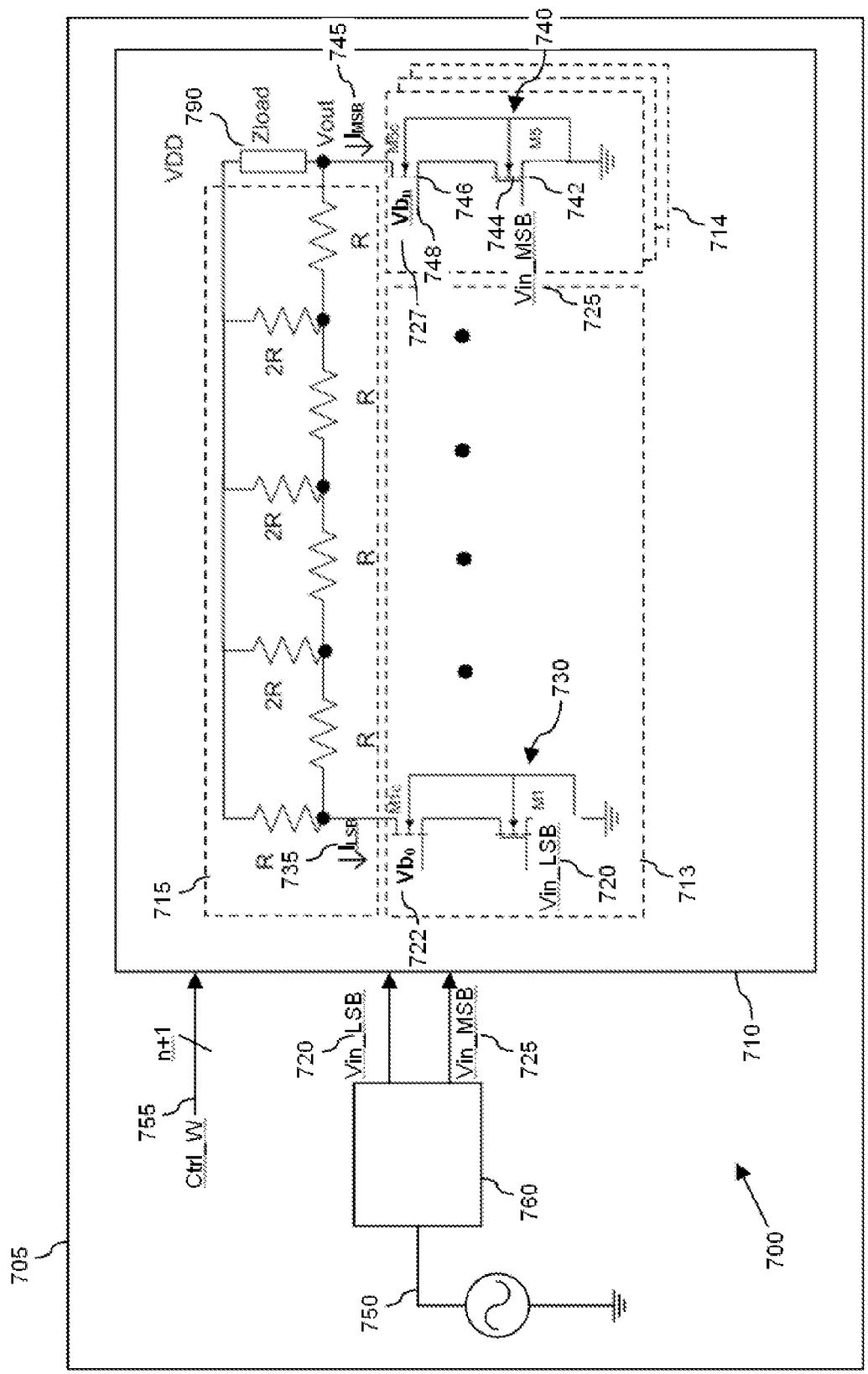
FIG. 7 illustrates a simplified circuit diagram of an example of a radio frequency (RF) amplifier module.

Referring now to FIG. 7, there is illustrated a simplified circuit diagram of an example of a radio frequency (RF) amplifier module 700, which in the illustrated example is implemented within an integrated circuit device 705. The RF amplifier module 700 comprises a digitally controllable amplifier 710 arranged to receive a first biased signal (Vin_LSB) 720 comprising an alternating current (AC) signal 750 to be amplified and a first direct current (DC) bias component, and second biased signal (Vin_MSB) 725 comprising the AC signal 750 to be amplified and a second DC bias component. The digitally controllable amplifier 710 is further arranged to receive a digital control signal (Ctrl_W) 755 comprising at least one less significant bit (LSB) component, for example comprising a least significant bit (Vb$_0$) 722, and at least one more significant bit (MSB) component, for example comprising a most significant bit (Vb$_n$) 727. In the illustrated example, the digitally controllable amplifier 710 comprises an LSB module 713 comprising one or more gain cells, such as the gain cell illustrated at 730, arranged to selectively output a load current component (I$_{LSB}$) 735 corresponding to the first biased signal 720 in accordance with at least one respective bit within the LSB component of the digital control signal 755, such as bit (Vb$_0$) 722. The digitally controllable amplifier 710 of the illustrated example further comprises an MSB module 714 comprising one or more gain cells, such as the gain cell illustrated at 740, arranged to selectively output a load current component (I$_{MSB}$) 745 corresponding to the second biased signal 725 in accordance with at least one respective bit within the MSB component of the digital control signal 755, such as bit (Vb$_n$) 727.

In this manner, the LSB and MSB components 713, 714 of the digitally controllable amplifier 710 may be provided with substantially independent DC bias voltages. As such, and as described in greater detail below, improved isolation of gain cells may be achieved within, for example, the MSB component 714 when only gain cells 730 within the LSB component 713 are active (e.g. when the digitally controllable amplifier 710 is operating at low power levels), for example by increasing the DC bias voltage of the biased signal 725 provided to the gain cells of the MSB component 714. Thus, by improving the isolation of the gain cells 740 within the MSB component 714 when the digitally controllable amplifier is operating at low power levels in this manner, unwanted leakage signals may also be reduced at low power levels, thereby enabling an improved gain control range to be achieved. In essence, reducing unwanted signal improves isolation and thereby improves the gain range.

The RF amplifier module 705 further comprises a biasing component 760 arranged to receive the AC signal 750 to be amplified and to output the first and at least one further biased signals 720, 725 to the digitally controllable amplifier 705.

Figure 8:
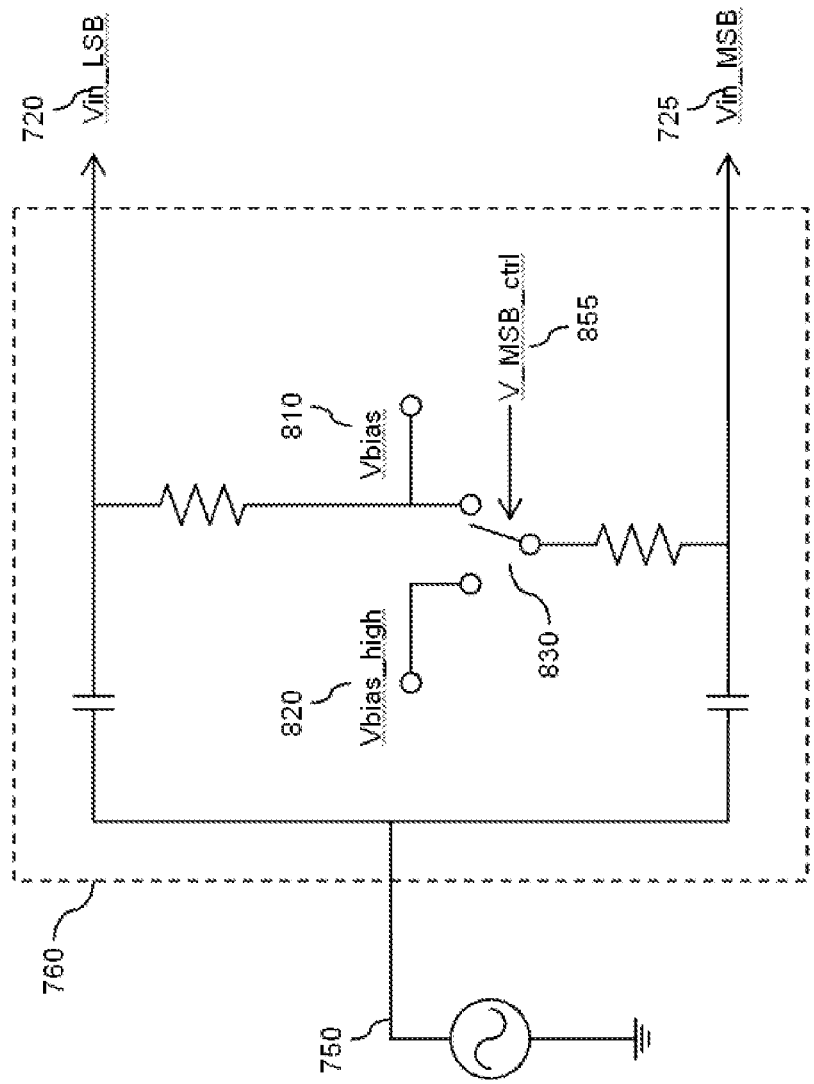
FIG. 8 illustrates a simplified circuit diagram of an example of a biasing component.

FIG. 8 illustrates a simplified circuit diagram of an example of the biasing component 760. In accordance with some example embodiments of the present invention, the biasing component 760 is arranged to apply a first, operating DC bias voltage (Vbias) 810 to the second biased signal 725 when the digitally controllable amplifier 710 is configured to operate in a higher gain mode wherein the MSB module 714 is configured to output a load current component (I$_{MSB}$) 745, and to apply a second, higher DC bias voltage (Vbias_high) 820 to the second biasing signal 725 when the digitally controllable amplifier 710 is configured to operate in a lower gain mode, wherein the MSB module 714 is configured to not output a load current component (I$_{MSB}$) 745.

In particular for the illustrated example, the biasing component 760 comprises a switching element 830 configurable to operably couple either of the first, operating DC bias voltage 810 or the second, higher DC bias voltage 820 to the AC signal 750 to generate the second biasing signal 725 in accordance with a control signal (V_MSB_ctrl) 855. In this manner, the biasing component 760 is controllable, via the control signal 855, to apply the first, operating DC bias voltage 810 to the second biased signal 725 when the digitally controllable amplifier 710 is configured to operate in a higher gain mode, and to apply the second, higher DC bias voltage 820 to the second biasing signal 725 when the digitally controllable amplifier 710 is configured to operate in a lower gain mode. In the illustrated example, the biasing component 760 is also arranged to apply the first, operating DC bias voltage 810 to the first biased signal 720.

Figure 1:
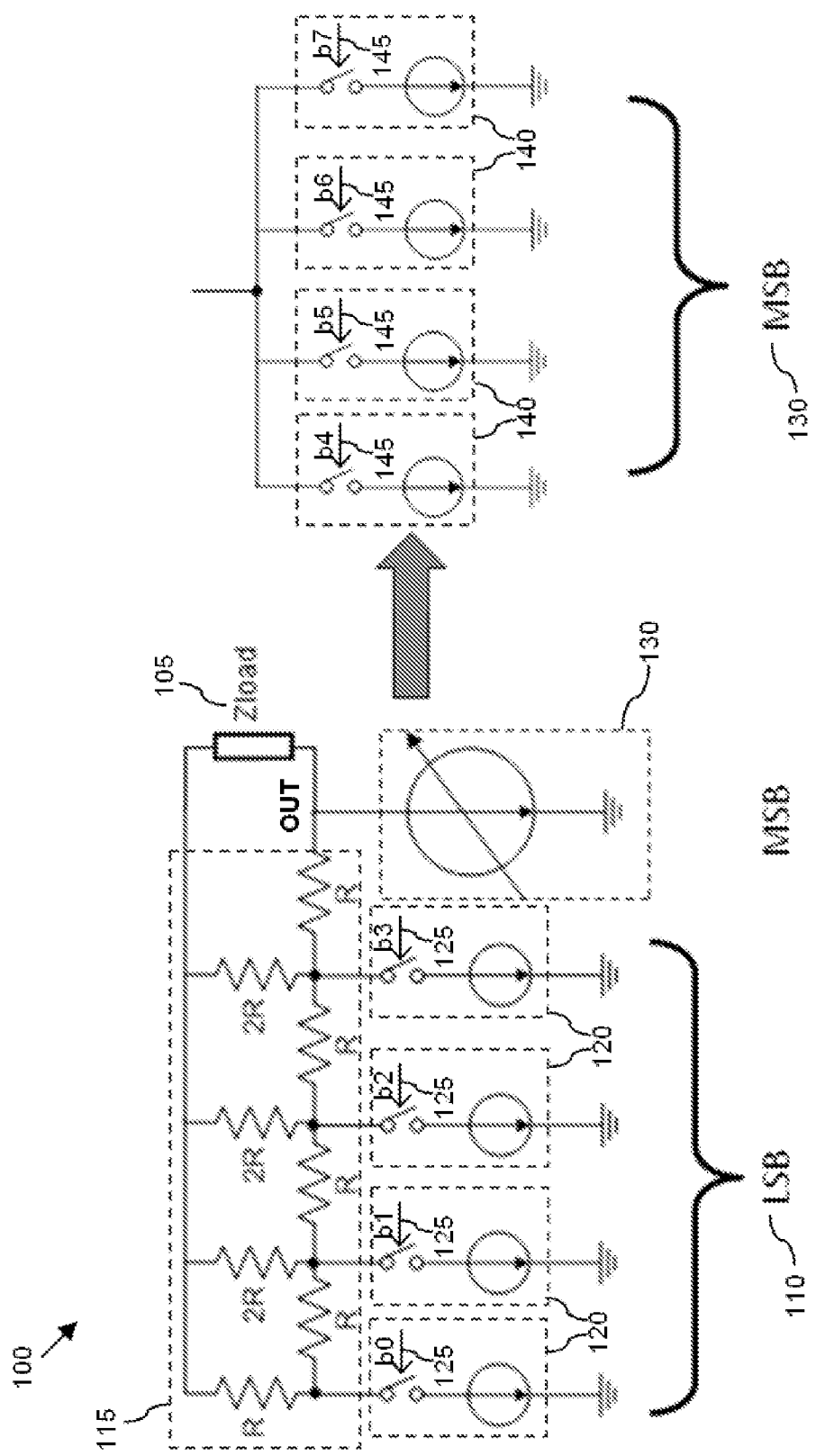
FIG. 1 illustrates a simplified circuit diagram of an example of a digitally programmable amplifier.
Figure 2:
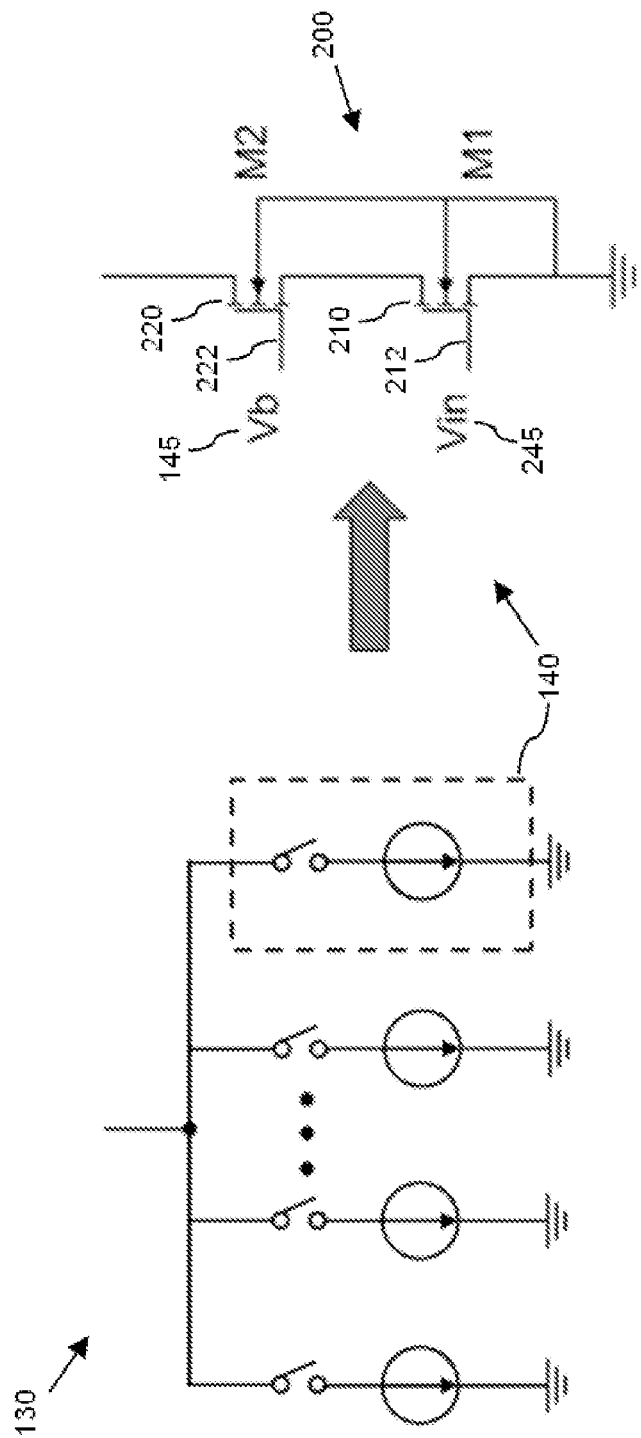
FIG. 2 illustrates a simplified circuit diagram of an example of an implementation of a unit gain cell.
Figure 3:
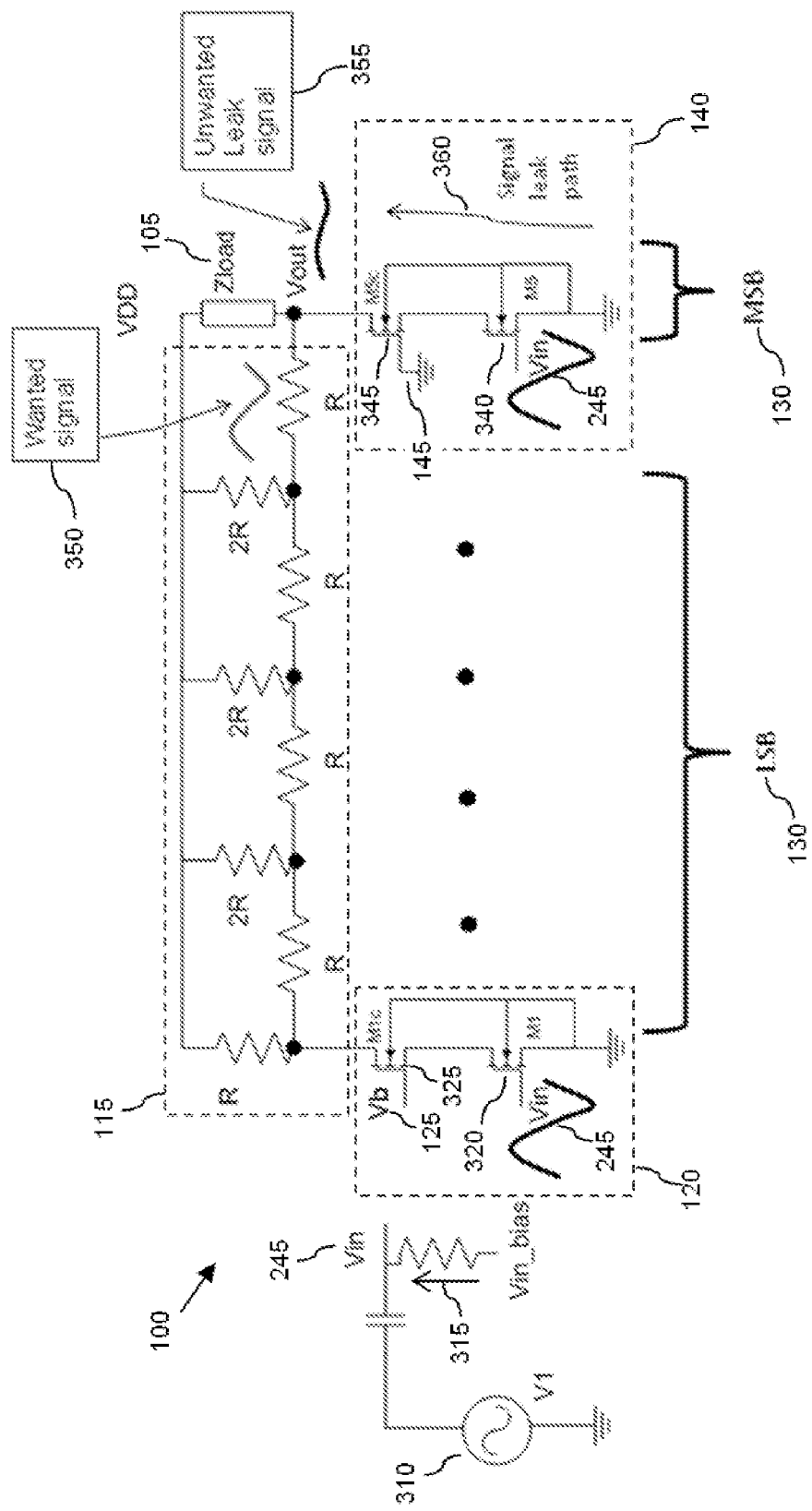
FIG. 3 illustrates a simplified circuit diagram of the digitally programmable amplifier of FIG. 1 in which the gain cells of the LSB and MSB components are implemented by way of cascode common source amplifiers.

Referring back to FIG. 7, for clarity only a single gain cell 740 is illustrated within the MSB component 714. However, it is contemplated that the MSB module 714 may comprise a plurality of gain cells 740, for example in a similar manner to the MSB component 130 of the prior art amplifier 100 illustrated in FIG. 1. As such, the plurality of MSB gain cells 740 may be operably coupled in parallel and each arranged to receive, and be controllable via, a respective bit within the MSB component of the digital control signal 755, such as bit (Vb$_n$) 727. In some examples, the gain cells 740 of the MSB component 714 may comprise unary weighted cells, binary weighted cells, or a combination of unary and binary weighted cells. In some examples, each gain cell 740 within the MSB component 714 may be independently controllable, and arranged to selectively output load current components 745 corresponding to the second biased signal 725 in accordance with respective bits within the MSB component of the digital control signal 755.

In some example of the present invention, the LSB module 713 may also comprise a plurality of controllable gain cells 730 arranged to be individually selectable to output load current components 735 corresponding to the first biased signal 720 in accordance with respective bits within the LSB component of the digital control signal 755. For example, only one gain cell 730 within the LSB component 713 is switched on (via the respective control bit) at a time.

In some examples, the LSB component 713 and the MSB component 714 may be arranged to operate exclusively of each other such that when a gain cell 730 of the LSB component 713 is switched on, all gain cells 740 of the MSB component 714 are switched off. Conversely, when at least one gain cell 740 of the MSB component 714 is switched on, all gain cells 730 of the LSB component 713 are switched off.

In the illustrated example, the digitally controllable amplifier 710 comprises a resistor attenuator ladder, and in particular an R-2R resistor attenuator ladder 715. It will be appreciated that an alternative resistor attenuator ladder configuration may equally be implemented, such as more generally an R-N*R resistor attenuator ladder. The plurality of gain cells 730 within the LSB module 713 are coupled to respective tap points within the R-2R resistor attenuator ladder 715. The R-2R resistor attenuator ladder 715 is operably coupled to a load impedance (Zload) 790 of the digitally controllable amplifier 710, and arranged to attenuate load current components ($I_{LSB}$) 735 of the gain cells 730 within the LSB module 713. In contrast for the illustrated example, the gain cells 740 of the MSB module 714 are arranged to be coupled to the load impedance 790 of the digitally controllable amplifier 710. In the illustrated example, the gain cells 740 of the MSB module 714 are illustrated as being coupled substantially directly to the load impedance 790. However, it will be appreciated that the gain cells 740 may be coupled to the load impedance 790 via a balun or the like (not shown).

Figure 4:
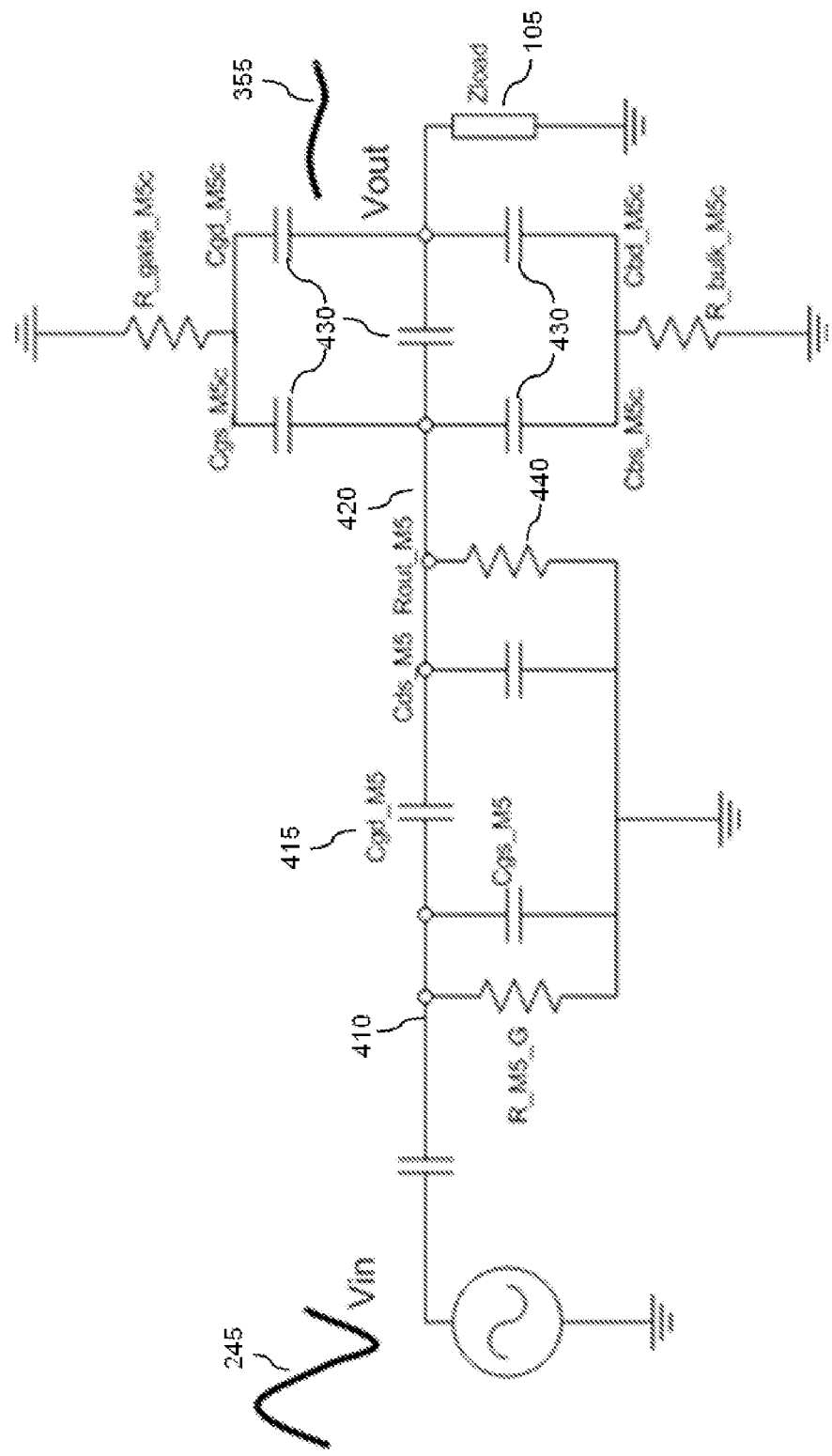
FIG. 4 illustrates a simplified circuit diagram of a small signal equivalent network for gain cells when in an off-state.

In the illustrated example, each of the gain cells 740 of the MSB module 714 comprises a cascode common source amplifier. The cascode common source amplifier comprises a first transistor (M5) 742 arranged to receive at a gate 744 thereof the second biased signal 725, and a second transistor (M5c) 746 arranged to receive at a gate 748 thereof the respective bit 727 within the MSB component 714 of the digital control signal 755. The simplified circuit diagram of a small signal equivalent network for a gain cell comprising a cascode common source amplifier illustrated in FIG. 4 applies equally to the cascode common source amplifier arrangement of FIG. 7.

Figure 5:
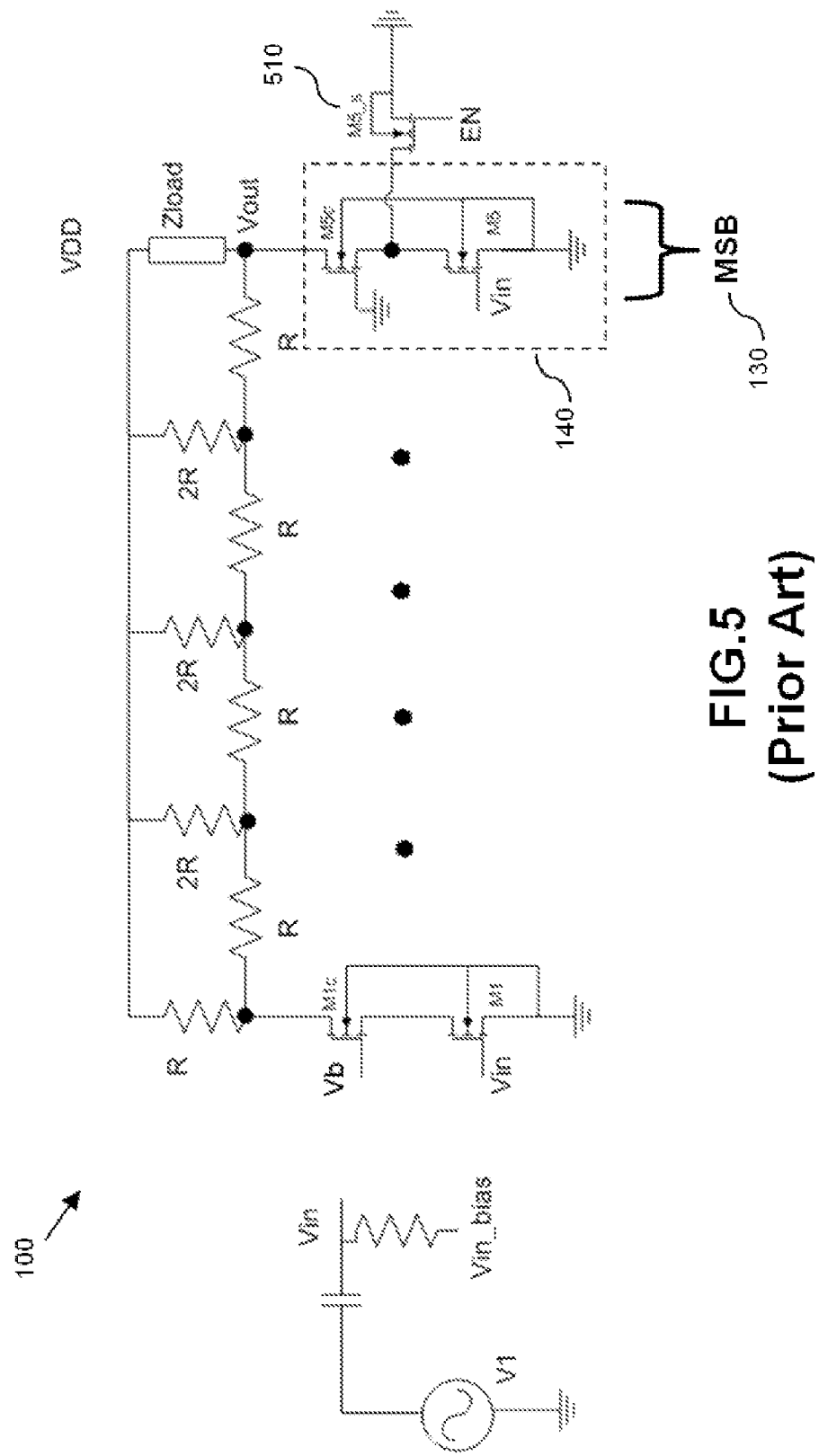
FIG. 5 illustrates a simplified circuit diagram of the digitally programmable amplifier of FIG. 3 comprising a known solution to improving the isolation of the gain cells within the MSB component when in an off state.
Figure 9:
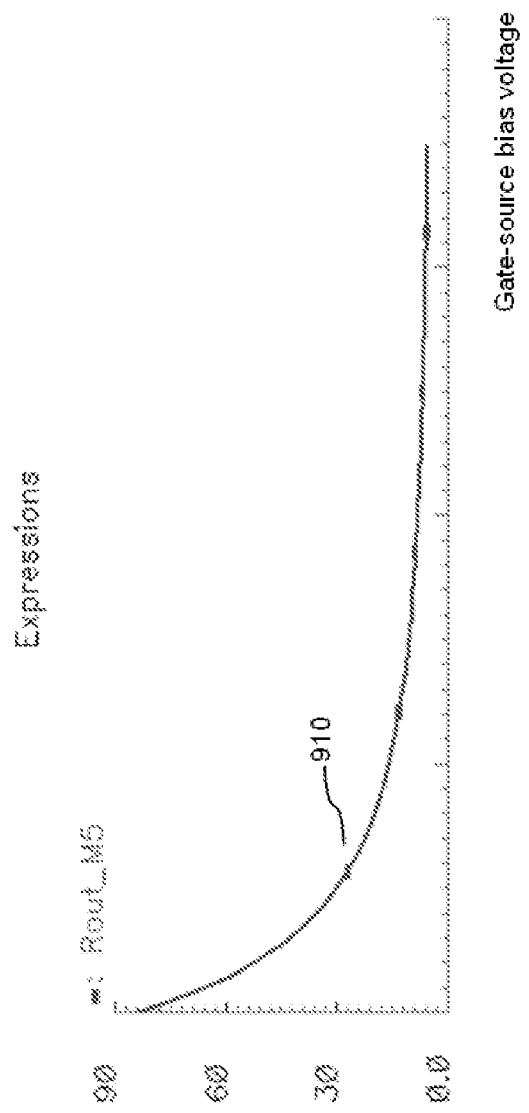
FIG. 9 illustrates an example of a plot showing drain node output impedance against gate bias of a cascode common source amplifier transistor.

FIG. 9 illustrates examples of a first plot 910 showing the output impedance (Rout_M5) of the drain node of the first transistor (M5) 742 versus the gate bias of a cascade common source amplifier. By applying a higher DC bias voltage to the second biasing signal 725, the first transistor (M5) 742 of the cascode common source amplifier will be forced into a deep linear region of operation. Thus, and as can be seen in FIG. 9, the output impedance of the drain node of the first transistor (M5) 742 will be reduced, thereby significantly reducing the signal leakage at the drain node of the first transistor (M5) 742, without compromising performance (e.g. as a result of additional parasitic capacitance on the drain of the first transistor (M5) in the prior art solution of FIG. 5), and increasing circuit area or layout complexity.

Figure 10:
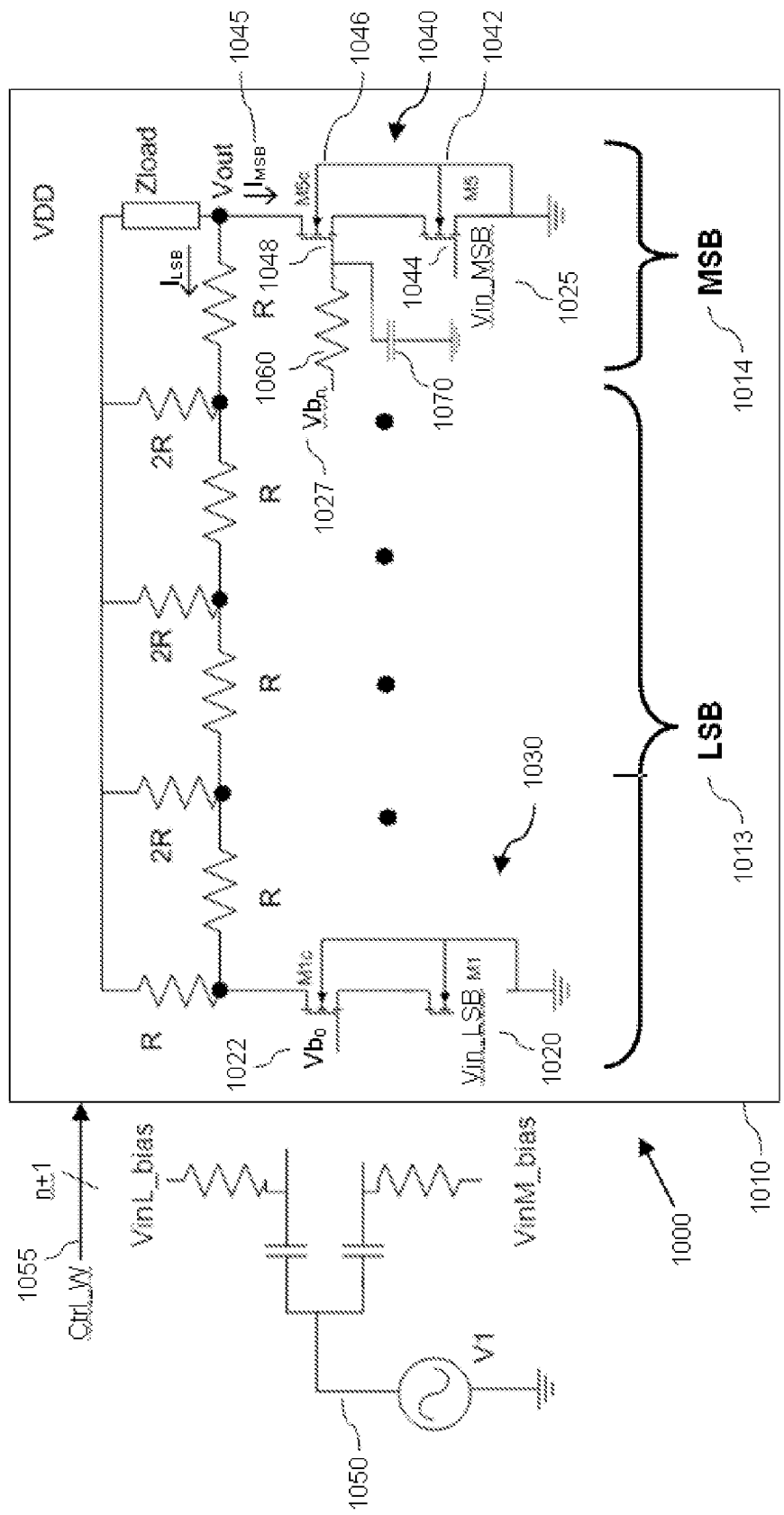
FIG. 10 illustrates a simplified circuit diagram of an alternative example of a radio frequency (RF) amplifier module.

Referring now to FIG. 10, there is illustrated a simplified circuit diagram of an alternative example of a radio frequency (RF) amplifier module 1000. The RF amplifier module 1000 comprises a digitally controllable amplifier 1010 arranged to receive a first biased signal (Vin_LSB) 1020 comprising an alternating current (AC) signal (V1) 1050 to be amplified and a first direct current (DC) bias component, and second biased signal (Vin_MSB) 1025 comprising the AC signal 1050 to be amplified and a second DC bias component. The digitally controllable amplifier 1010 is further arranged to receive a digital control signal comprising at least one less significant bit (LSB) component, for example comprising a least significant bit (Vb$_0$) 1022, and at least one more significant bit (MSB) component, for example comprising a most significant bit (Vb$_n$) 1027. In the illustrated example, the digitally controllable amplifier 1010 comprises an LSB module 1013 comprising one or more gain cells, such as the gain cell illustrated at 1030, arranged to selectively output an LSB load current component $I_{LSB}$. The digitally controllable amplifier 1010 of the illustrated example further comprises an MSB module 1014 comprising one or more gain cells, such as the gain cell illustrated at 1040, arranged to selectively output an MSB load current component $I_{MSB}$ 1045. Each of the gain cells 1040 of the MSB module 1014 comprises a cascode common source amplifier. The cascode common source amplifier comprises a first transistor (M5) 1042 arranged to receive at a gate 1044 thereof the second biased signal 1025, and a second transistor (M5c) 1046 arranged to receive at a gate 1048 thereof the respective bit 1027 within the MSB component 1014 of the digital control signal (Ctrl_W) 1055.

Conventionally for cascode common source amplifier gain cell implementations, and as illustrated in relation to the MSB gain cell 1040 in FIG. 10, an AC choke resistor 1060 is located between the DC control bit signal 1027 and the second transistor gate 1048. Such a choke resistor forms a high impedance node during normal operation. Accordingly, a decoupling capacitor 1070 may be added on the gate of the second transistor (M5c) 1046 to provide an AC path to ground during normal operation, thereby helping any AC leakage signal drain to ground. For example, and referring back to FIG. 4, by providing the decoupling capacitor 1070 between the gate of the second transistor M5c, the decoupling capacitor 1070 helps to stop the leakage path through the series connection of Cgs_M5c and Cgd_M5c.

In the examples hereinbefore described, each gain cell 740, 1040 within the MSB component 714, 1014 has comprised a cascode common source amplifier, wherein the transistors 742, 746, 1042, 1046 comprise single gates. However, it is contemplated that multiple gated transistors (MGTRs) may be implemented within the cascode common source amplifiers of at least the gain cells 740, 1040 within the MSB component 714, 1014 to improve linearity.

Figure 11:
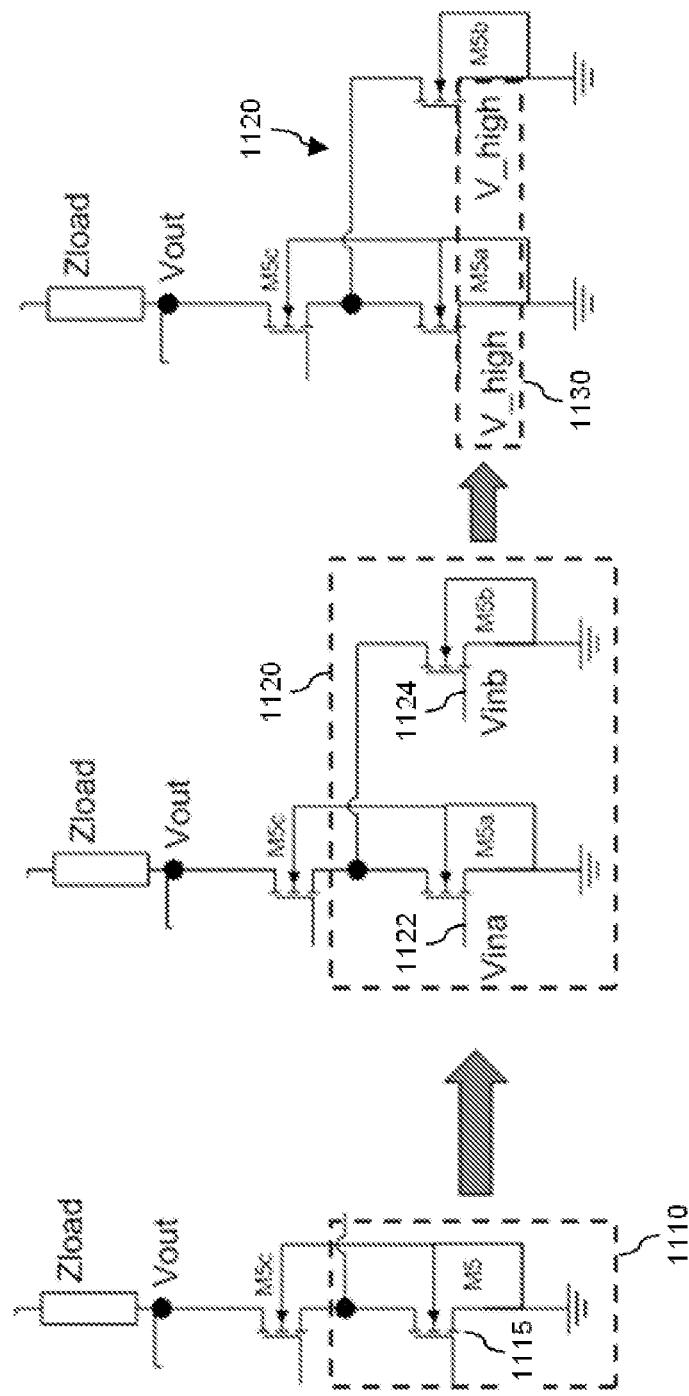
FIG. 11 illustrates an example of a multiple gated transistors (MGTRs) cascode common source amplifier.

For example, and as illustrated in FIG. 11, a single gate implementation of a gain cell is illustrated at 1110, where a first transistor (M5) 1115 is arranged to receive at a gate node thereof a biased signal comprising an AC signal to be amplified and a DC bias voltage, such as the second biased signal 725 of FIG. 7. In an MGTR implementation of a gain cell, such as illustrated at 1120, the single transistor (M5) 1115 is replaced by at least two transistors 1122, 1124 operably coupled in parallel, and each arranged to receive at gate nodes thereof biased signals Vina, Vinb comprising an AC signal to be amplified and different DC bias voltages. When the transistor gate nodes are tied to high level voltage V_high as illustrated at 1130, for example when a higher DC bias voltage is applied to the biased signal as described above, because at least one of the transistors 1122, 1124 may be forced to work at a bias point closer to or below the threshold voltage, they comprise a reduced combined output impedance ratio compared with a single transistor 1115 in the single gate implementation 1110. Thus, even better isolation of the gain cells in an off state may be achieved.

Figure 12:
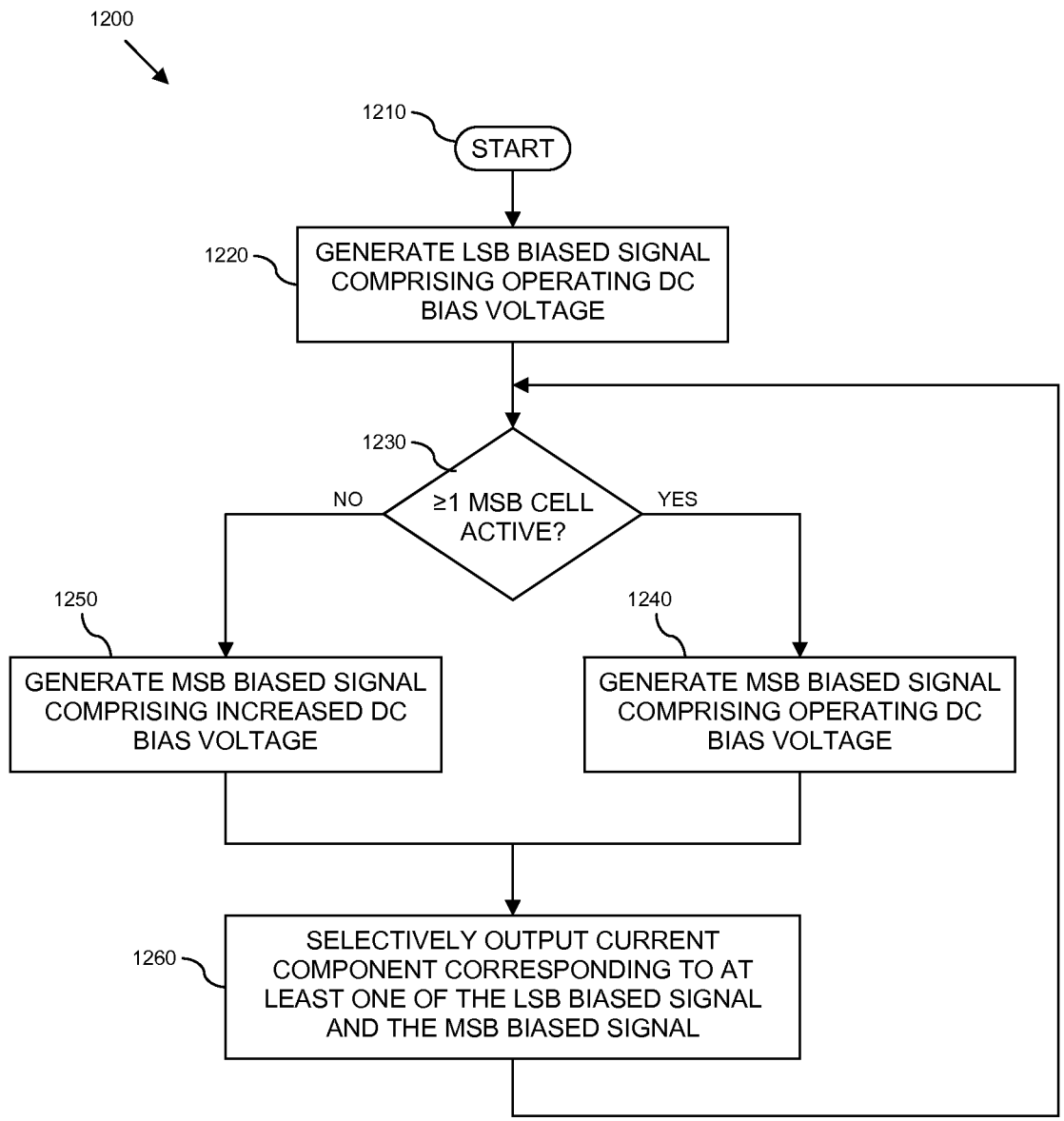
FIG. 12 illustrates a simplified flowchart of an example of a method of digitally controllable amplification of an RF signal.

Referring now to FIG. 12, there is illustrated a simplified flowchart 1200 of an example of a method of digitally controllable amplification of an RF signal. The method starts at 1210, and moves on to 1220 where a first (LSB) biased signal comprising an alternating current (AC) signal to be amplified and a first, operating direct current (DC) bias component is generated. Next, at 1230, it is determined whether at least one MSB gain cell is active. If an MSB gain cell is active, the method moves on to 1240 where a further (MSB) biased signal comprising the AC signal to be amplified and the first, operating DC bias component is generated. Conversely, if no MSB gain cell is active, the method moves on to 1250 where the further (MSB) biased signal is generated comprising the AC signal to be amplified and a second, increased DC bias component. In this manner, the first, operating DC bias may be applied to the MSB biased signal when a load current corresponding to the MSB biased signal is to be output, and to apply a higher DC bias to the MSB biasing signal when a load current corresponding to the MSB biased signal is not to be output. Having generated the MSB biased signal, the method moves on to 1260, where at least one load current component corresponding to at least one of the LSB biased signal and the MSB biased signal is selectively output in accordance with at least one respective bit within at least one digital control signal. The method then loops back to 1230.

The illustrated example embodiments of the present invention have, for the most part, been implemented using electronic components and circuits known to those skilled in the art. Accordingly, details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an', limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A radio frequency (RF) amplifier module comprising at least one digitally controllable amplifier arranged to receive:
    a first biased signal comprising an alternating current (AC) signal to be amplified and a first direct current (DC) bias component;
    at least one further biased signal comprising the AC signal to be amplified and an at least one further DC bias component; and
    at least one digital control signal comprising at least one less significant bit (LSB) component and at least one more significant bit (MSB) component, the at least one digitally controllable amplifier comprising:
    at least one LSB module comprising at least one gain cell arranged to selectively output a load current component corresponding to the first biased signal in accordance with at least one respective bit within the LSB component of the at least one digital control signal; and
    at least one MSB module comprising at least one gain cell arranged to selectively output a load current component corresponding to the at least one further biased signal in accordance with at least one respective bit within the MSB component of the at least one digital control signal,
    the at least one RF amplifier module further comprising at least one biasing component arranged to receive the AC signal to be amplified and to output the first and at least one further biased signals to the at least one digitally controllable amplifier, wherein the at least one biasing component is further arranged to:
    apply a first, operating DC bias voltage to the at least one further biased signal when the at least one digitally controllable amplifier is configured to operate in a higher gain mode and when the at least one MSB module is configured to output a load current component corresponding to the at least one further biased signal in accordance with at least one respective bit within the MSB component of the at least one digital control signal; and apply a second, higher DC bias voltage, which is higher than the first, operating DC bias voltage, to the at least one further biasing signal when the at least one digitally controllable amplifier is configured to operate in a lower gain mode and when the at least one MSB module is not configured to output a load current component corresponding to the at least one further biased signal in accordance with at least one respective bit within the MSB component of the at least one digital control signal.

2. The RF amplifier module of claim 1 wherein the MSB module comprises a plurality of independently controllable gain cells arranged to selectively output load current components corresponding to the at least one further biased signal in accordance with respective bits within the MSB component of the at least one digital control signal.

3. The RF amplifier module of claim 1 wherein the LSB module comprises a plurality of controllable gain cells arranged to be individually selectable to output a load current component corresponding to the first biased signal in accordance with respective bits within the LSB component of the at least one digital control signal.

4. The RF amplifier module of claim 3 wherein the digitally controllable amplifier further comprises a resistor attenuator ladder structure, and the plurality of gain cells within the LSB module are coupled to respective tap points within the resistor attenuator ladder.

5. The RF amplifier module of claim 4 wherein the at least one gain cell of the MSB module is arranged to be coupled directly to a load impedance of the digitally controllable amplifier.

6. The RF amplifier module of claim 1 wherein the at least one gain cell of the MSB module comprises a cascode common source amplifier; the cascode common source amplifier comprising a first transistor arranged to receive at a gate thereof the at least one further biased signal and a second transistor arranged to receive at a gate thereof the respective bit within the MSB component.

7. The RF amplifier module of claim 6 wherein the at least one gain cell of the MSB module comprises a decoupling capacitance operably coupled to the gate of the second transistor of the cascode common source amplifier.

8. The RF amplifier module of claim 6 wherein the first transistor of the cascode common source amplifier comprises a multiple gated transistor arranged to receive at multiple gates thereof, the at least one further biased signal.

9. An integrated circuit device comprising a radio frequency (RF) amplifier module according to claim 1.

10. A wireless communication unit comprising a radio frequency (RF) amplifier module; the RF amplifier module comprises at least one digitally controllable amplifier arranged to receive:
a first biased signal comprising an alternating current (AC) signal to be amplified and a first direct current (DC) bias component;
at least one further biased signal comprising the AC signal to be amplified and an at least one further DC bias component; and
at least one digital control signal comprising at least one less significant bit (LSB) component and at least one more significant bit (MSB) component, the at least one digitally controllable amplifier comprising:
at least one LSB module comprising at least one gain cell arranged to selectively output a load current component corresponding to the first biased signal in accordance with at least one respective bit within the LSB component of the at least one digital control signal; and
at least one MSB module comprising at least one gain cell arranged to selectively output a load current component corresponding to the at least one further biased signal in accordance with at least one respective bit within the MSB component of the at least one digital control signal,
the at least one RF amplifier module further comprising at least one biasing component arranged to receive the AC signal to be amplified and to output the first and at least one further biased signals to the at least one digitally controllable amplifier; the at least one biasing component is further arranged to:
apply a first, operating DC bias voltage to the at least one further biased signal when the at least one digitally controllable amplifier is configured to operate in a higher gain mode and when the at least one MSB module is configured to output a load current component corresponding to the at least one further biased signal in accordance with at least one respective bit within the MSB component of the at least one digital control signal; and
apply a second, higher DC bias voltage, which is higher than the first, operating DC bias voltage, to the at least one further biasing signal when the at least one digitally controllable amplifier is configured to operate in a lower gain mode and when the at least one MSB module is not configured to output a load current component corresponding to the at least one further biased signal in accordance with at least one respective bit within the MSB component of the at least one digital control signal.

11. The wireless communication unit of claim 10 wherein the MSB module comprises a plurality of independently controllable gain cells arranged to selectively output load current components corresponding to the at least one further biased signal in accordance with respective bits within the MSB component of the at least one digital control signal.

12. The wireless communication unit of claim 10 wherein the LSB module comprises a plurality of controllable gain cells arranged to be individually selectable to output a load current component corresponding to the first biased signal in accordance with respective bits within the LSB component of the at least one digital control signal.

13. The wireless communication unit of claim 12 wherein the digitally controllable amplifier further comprises a resistor attenuator ladder structure, and the plurality of gain cells within the LSB module are coupled to respective tap points within the resistor attenuator ladder.

14. The wireless communication unit of claim 13 wherein the at least one gain cell of the MSB module is arranged to be coupled directly to a load impedance of the digitally controllable amplifier.

15. The wireless communication unit of claim 10 wherein the at least one gain cell of the MSB module comprises a cascode common source amplifier; the cascode common source amplifier comprising a first transistor arranged to receive at a gate thereof the at least one further biased signal and a second transistor arranged to receive at a gate thereof the respective bit within the MSB component.

16. A method of digitally controllable amplification of an RF signal, the method comprising:

generating a first biased signal comprising an alternating current (AC) signal to be amplified and a first direct current (DC) bias component;

generating at least one further biased signal comprising the AC signal to be amplified and an at least one further DC bias component; and selectively outputting at least one load current component corresponding to at least one from a group comprising:

the first biased signal in accordance with at least one respective bit within at least one less significant bit (LSB) component of at least one digital control signal; and the at least one further biased signal in accordance with at least one respective bit within at least one more significant bit (MSB) component of the at least one digital control signal, wherein the method further comprises applying the first DC bias to the at least one further biased signal when a load current corresponding to the at least one further biased signal is to be output, and to apply a higher DC bias, which is higher than the first DC bias, to the at least one further biasing signal when a load current corresponding to the at least one further biased signal is not to be output.

17. The method of claim 16 wherein the MSB module comprises a plurality of independently controllable gain cells and the method further comprises:

selectively outputting load current at least one load current component corresponding to the at least one further biased signal in accordance with respective bits within the MSB component of the at least one digital control signal.

18. The method of claim 16 wherein the LSB module comprises a plurality of controllable gain cells and the method further comprises:

individually selecting to output a load current component corresponding to the first biased signal in accordance with respective bits within the LSB component of the at least one digital control signal.

19. The method of claim 18 wherein the digitally controllable amplifier further comprises a resistor attenuator ladder structure, and the method further comprises:

coupling the plurality of gain cells within the LSB module to respective tap points within the resistor attenuator ladder.

20. The method of claim 19 further comprising coupling directly the at least one gain cell of the MSB module to a load impedance of the digitally controllable amplifier.

\* \* \* \* \*